US012712037B2

(12) United States Patent
Xu et al.

(10) Patent No.: US 12,712,037 B2
(45) Date of Patent: Aug. 18, 2026

(54) SELECTIVE DATA PATTERN WRITE SCRUB FOR A MEMORY SYSTEM

(71) Applicant: MICRON TECHNOLOGY, INC., Boise, ID (US)

(72) Inventors: Zhongguang Xu, San Jose, CA (US); Murong Lang, San Jose, CA (US); Zhenming Zhou, San Jose, CA (US)

(73) Assignee: Micron Technology, Inc., Boise, ID (US)

( * ) Notice: Subject to any disclaimer, the term of this patent is extended or adjusted under 35 U.S.C. 154(b) by 151 days.

(21) Appl. No.: 18/425,383

(22) Filed: Jan. 29, 2024

(65) Prior Publication Data

US 2024/0233843 A1 Jul. 11, 2024

Related U.S. Application Data

(63) Continuation of application No. 17/463,207, filed on Aug. 31, 2021, now Pat. No. 11,929,127.

(51) Int. Cl.
*G11C 16/34* (2006.01)

(52) U.S. Cl.
CPC ...... *G11C 16/3495* (2013.01); *G11C 16/3404* (2013.01)

(58) Field of Classification Search
CPC ........................ G11C 16/3495; G11C 16/3404
See application file for complete search history.

(56) References Cited

U.S. PATENT DOCUMENTS 5,959,895 A * 9/1999 Imamiya ............ G11C 16/3404 365/185.24
6,816,409 B2 * 11/2004 Tanaka ............... G11C 16/3418 365/185.24
7,137,027 B2 * 11/2006 Shiota .................. G11C 16/349 365/185.09
7,437,631 B2 * 10/2008 Auclair .................. G11C 29/50 714/721
9,864,523 B2 * 1/2018 Camp ................... G06F 3/0688
10,990,537 B1 4/2021 Moertl et al.
11,049,580 B1 6/2021 Gautam et al.
2009/0132876 A1 5/2009 Freking et al.
2011/0096601 A1 4/2011 Gavens et al.

(Continued)

OTHER PUBLICATIONS

International Search Report and Written Opinion for International Application No. PCT/US2022/042075, mailed Dec. 21, 2022, 10 pages.

*Primary Examiner* — Jerome Leboeuf
*Assistant Examiner* — Christopher Lane Reece
(74) *Attorney, Agent, or Firm* — Lowenstein Sandler LLP

(57) ABSTRACT

A system includes a memory device having a plurality of memory cells and a processing device operatively coupled to the memory device. The processing device is to determine to perform a rewrite on at least a portion of the plurality of memory cells. The processing device can determine that a number of rewrite operations at first subset of memory cells storing a first logic state fail to satisfy a threshold criterion. The processing device can also cause a rewrite of data stored at a second subset of memory cells storing a second logic state in response to determining the number of rewrite operations performed at the first subset of memory cells fail to satisfy the threshold criterion.

18 Claims, 5 Drawing Sheets

(56) References Cited

U.S. PATENT DOCUMENTS

| | | | | |
|---|---|---|---|---|
| 2011/0219203 | A1* | 9/2011 | Nurminen .......... | G11C 13/0069<br>711/E12.001 |
| 2015/0234706 | A1 | 8/2015 | Alrod et al. | |
| 2017/0262197 | A1 | 9/2017 | Tan | |

* cited by examiner

SELECTIVE DATA PATTERN WRITE SCRUB FOR A MEMORY SYSTEM

RELATED APPLICATIONS

The present application is a continuation of application Ser. No. 17/463,207, filed Aug. 31, 2021, which is incorporated by reference herein.

TECHNICAL FIELD

Embodiments of the disclosure relate generally to memory sub-systems, and more specifically, relate to selective data pattern write scrub for a memory system.

BACKGROUND

A memory sub-system can include one or more memory devices that store data. The memory devices can be, for example, non-volatile memory devices and volatile memory devices. In general, a host system can utilize a memory sub-system to store data at the memory devices and to retrieve data from the memory devices.

BRIEF DESCRIPTION OF THE DRAWINGS

The disclosure will be understood more fully from the detailed description given below and from the accompanying drawings of various embodiments of the disclosure. The drawings, however, should not be taken to limit the disclosure to the specific embodiments, but are for explanation and understanding only.

DETAILED DESCRIPTION

Figure 1:
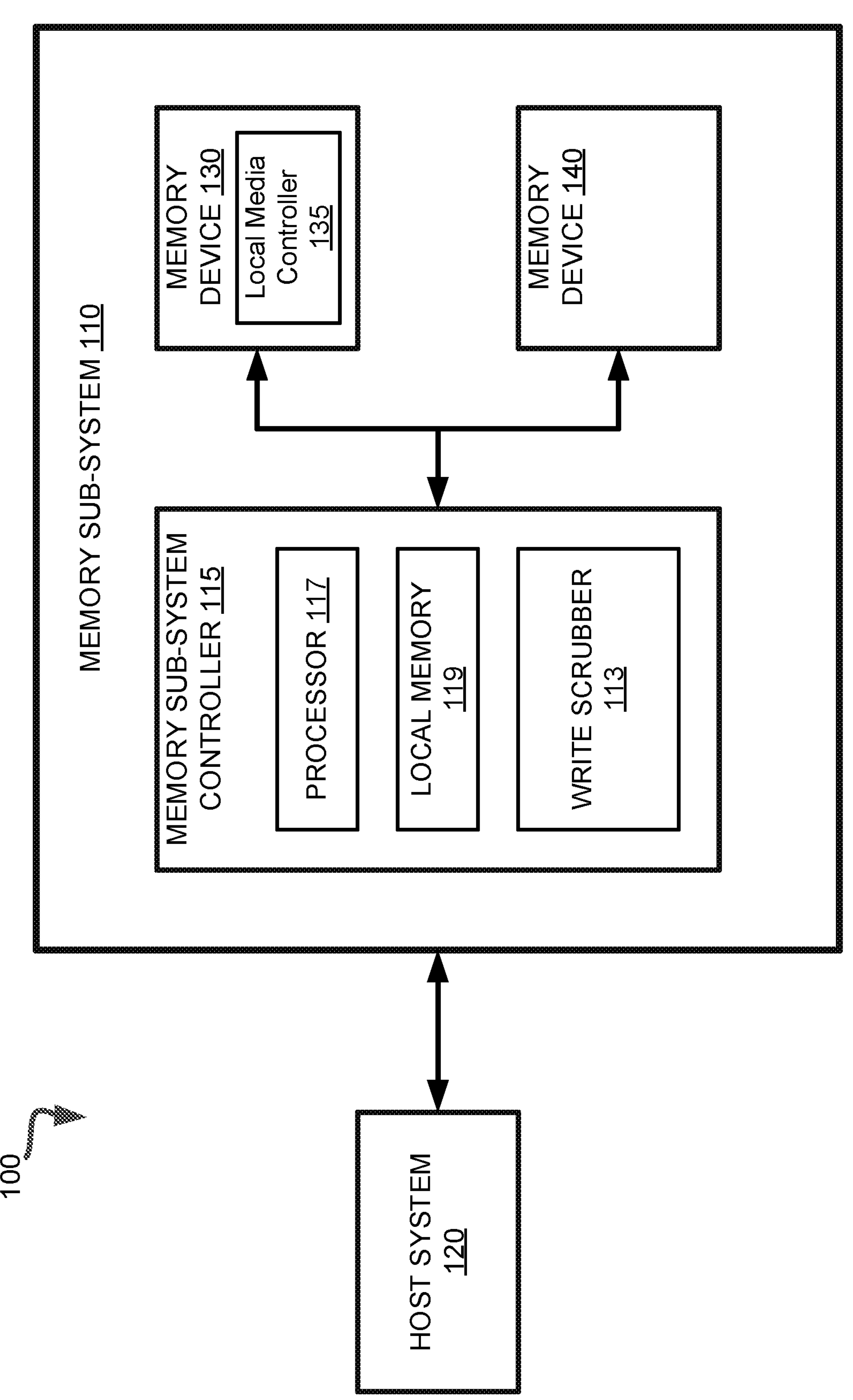
FIG. 1 illustrates an example computing environment that includes a memory sub-system in accordance with some embodiments.

Aspects of the present disclosure are directed to a selective data pattern write scrub for a memory system. A memory sub-system can be a storage device, a memory module, or a hybrid of a storage device and memory module. Examples of storage devices and memory modules are described below in conjunction with FIG. 1. In general, a host system can utilize a memory sub-system that includes one or more memory components, such as memory devices that store data. The host system can provide data to be stored at the memory sub-system and can request data to be retrieved from the memory sub-system.

A memory sub-system can include high density non-volatile memory devices where retention of data is desired when no power is supplied to the memory device. One example of non-volatile memory devices is a three-dimensional cross-point ("3D cross-point") memory device, which is a cross-point array of non-volatile memory cells. A cross-point array of non-volatile memory cells can perform bit storage based on a change of bulk resistance, in conjunction with a stackable cross-gridded data access array. Other examples of non-volatile memory devices are described below in conjunction with FIG. 1. That is, the embodiment is not limited to three-dimensional cross-point or other memory technologies. A non-volatile memory device is a package of one or more dies. Each die can consist of one or more partitions. For some types of non-volatile memory devices (e.g., 3D cross-point devices), each partition consists of a set of pages. Each page consists of a set of memory cells ("cells"). A cell is an electronic circuit that stores information. Depending on the cell type, a cell can store one or more bits of binary information, and has various logic states that correlate to the number of bits being stored. The logic states can be represented by binary values, such as "0" and "1", or combinations of such values.

Three-dimensional (3D) cross-point memory devices can group pages across dice and channels to form management units (MUs). An MU can include host data and corresponding metadata. A memory sub-system controller can send and receive user data and corresponding metadata as managed units to and from memory devices. A super management unit (SMU) is a group of one or more MUs that are managed together. For example, a memory sub-system controller can perform media management operations (e.g., wear level operations, refresh operations, etc.) on SMUs. Other examples of media management operations include garbage collection and scrub operations, the latter of which is the subject of this disclosure. In some memory devices, such as NAND memory devices, the SMUs can be understood to include one or more physical blocks or one or more super blocks (addressed by logical block address) that are managed together while the MUs can each include one or more pages that are transferred or programmed together.

A memory cell (or "cell") is an electronic circuit that stores information. Depending on the cell type, a cell can store one or more bits of binary information, and has various logic states that correlate to the number of bits being stored. The logic states can be represented by binary values, such as "0" (or a reset state) and "1" (or a set state), or combinations of such values. The various logic states have corresponding threshold voltage levels. A threshold voltage (Vt) is the voltage applied to the cell circuitry (e.g., control gate at which a transistor becomes conductive) to set the state of the cell. A cell is set to one of its logic states based on the Vt that is applied to the cell. For example, if a high Vt is applied to a single-level cell (SLC), a charge will be present in the cell, setting the SLC to store a logic 0. If a low Vt is applied to the SLC, charge will be absent in the cell, setting the SLC to store a logic 1.

The demarcation voltage (or voltage demarcation (VDM) level) can be a particular voltage that is applied to memory cells of a memory component to read the data stored at the memory cells. For example, if a threshold voltage (Vt) of a particular memory cell is identified as being below the demarcation voltage (e.g., VDM level) that is applied to the particular memory cell, then the data stored at the particular memory cell can be read as a particular value (e.g., a logical '1') or determined to be in a particular state (e.g., a set state). If the threshold voltage of the particular memory cell is identified as being above the demarcation voltage, then the data stored at the particular memory cell can be read as another value (e.g., a logical '0') or determined to be in another state (e.g., a reset state). Thus, the demarcation voltage can be applied to memory cells to determine values stored at the memory cells.

The threshold voltage or the threshold voltage distribution of multiple memory cells can shift or change over time, also referred to as voltage threshold drift. For example, a threshold voltage distribution of memory cells storing a logic '1' or a threshold distribution of memory cells storing a logic '0' can drift over time and the respective threshold voltage distribution can increase. The rate of drift in threshold voltages can increase (e.g., happen more quickly) as a memory device of them memory sub-system ages. When the threshold voltage of a memory cell changes, the application of the demarcation voltage can be inaccurate relative to the changed threshold voltage. For example, a memory cell storing a logic '1' can undergo a voltage threshold drift and have the resulting threshold voltage be greater than the demarcation voltage. Accordingly, when the demarcation voltage is applied to the memory cell, the data stored at the memory cell can be misread and incorrectly interpreted as a logic '0.' That is, voltage drift can cause inaccurate readings of memory cells.

For these reasons, the memory sub-system controller causes data of the memory device to be scrubbed to prevent these errors. Scrubbing is performed by re-writing the data in each memory device, which involves first reading the data and then rewriting the data to reset the threshold voltage states in the memory cells of each memory device. Some memory sub-systems can rewrite data to a page. Rewriting the memory cells of the page can cause additional memory cell (media) degradation—e.g., memory cells can be written to a threshold number of times and rewriting each memory cell of a page during a scrub cycle can decrease the life of the memory cell. This can be particularly prevalent at an end of life state for the memory system—e.g., the rate of voltage threshold drift can increase at the end of life causing more scrub cycles and media degradation. Additionally, operations such as scrubbing can consume bandwidth and thus degrade the memory sub-system performance.

Aspects of the present disclosure address the above and other deficiencies by adapting a memory sub-system controller to perform a selective data pattern write scrub. For example, the memory sub-system controller can scrub memory cells storing a certain logic state (e.g., logic '0') less frequently by not scrubbing the memory cells storing '0' every scrub cycle. For example, a memory sub-system controller can determine the maximum voltage threshold for memory cells—e.g., the maximum voltage threshold at which the memory cells are operational. Based on the maximum voltage threshold, the memory sub-system can determine the threshold number of periodic scrub cycles during which the memory sub-system can refrain from scrubbing the memory cells storing the logic '0', i.e., the number of scrub cycles during which the memory sub-system can avoid rewriting the memory cells before the voltage threshold drift exceeds the maximum voltage threshold. Upon performs a scrub operation, the memory sub-system controller can increase a scrub operation counter.

For example, a memory sub-system controller can send a scrub command to a memory device to avoid writing to memory cells that store a logic '0' in a page. The memory sub-system controller can also instruct the memory device to scrub (e.g., rewrite) the memory cells that store a logic '1'—e.g., the memory sub-system controller can scrub a certain logic state each scrub cycle. When the local memory controller (e.g., a logic, or peripheral components) at the memory device receives the scrub command, the local memory controller can read all of the data out of the page. Accordingly, the local memory controller can determine the logic value stored at each memory cell. When writing back to the page, the local memory controller can be programmed to skip (e.g., by inhibiting corresponding bitlines) memory cells storing the logic '0.' Accordingly, the local memory controller can write memory cells storing the logic '1' while skipping memory cells storing the logic '0'. The memory sub-system controller can then increase the scrub counter when sending a scrub command. When the scrub counter satisfies (e.g., exceeds or meets) the threshold number of periodic scrub cycles, the memory sub-system controller can send a scrub command to the memory device to scrub memory cells storing both the logic '0' and the logic '1'. Accordingly, the local memory controller can read out all of the data and rewrite the logic value read back to the memory cells of the page.

In some embodiments, the memory sub-system can adjust the threshold quantity of scrub cycles the memory sub-system can refrain from scrubbing the memory cells of the first logic state. For example, as the memory sub-system ages and the threshold voltage drift occurs at a faster rate, the threshold quantity of scrub cycles can decrease. Accordingly, the memory sub-system can adapt to the rate of voltage threshold drift as the memory sub-system approaches end of life.

Advantages of the present disclosure include, but are not limited to reduction of media degradation. For example, memory cells storing the first logic state are rewritten less frequently. Accordingly, in most situations, assuming the uniform distribution of the two logical states of the memory cells, only half of the memory cells would need to be scrubbed, thus reducing the media wear. Additionally, because half of the memory cells are scrubbed and rewritten to, the bandwidth utilization of the memory-subsystem by the background scrub operations is decreased, since the memory sub-system rewrites less memory cells, reduces data traffic, and is able to complete the scrub operation in a shorter duration compared with rewriting each memory cell. Further, only rewriting the memory cells storing the second logic state can increase a read margin between a distribution of the first logic state and the second logic state. For example, by refraining from rewriting memory cells of the first logic state, a voltage threshold drift can cause a respective difference between a threshold voltage of a memory cell storing the second logic state and a threshold voltage of a memory cell storing the first logic state to increase. Accordingly, it can be less likely utilizing the demarcation voltage causes inaccurate readings of the memory cell as described with reference to FIG. 2 and FIG. 3.

FIG. 1 illustrates an example computing environment 100 that includes a memory sub-system 110 in accordance with some embodiments of the present disclosure. The memory sub-system 110 can include media, such as one or more volatile memory devices (e.g., memory device 140), one or more non-volatile memory devices (e.g., memory device 130), or a combination of such.

A memory sub-system 110 can be a storage device, a memory module, or a hybrid of a storage device and memory module. Examples of a storage device include a solid-state drive (SSD), a flash drive, a universal serial bus (USB) flash drive, an embedded Multi-Media Controller (eMMC) drive, a Universal Flash Storage (UFS) drive, and a hard disk drive (HDD). Examples of memory modules include a dual in-line memory module (DIMM), a small outline DIMM (SO-DIMM), and a non-volatile dual in-line memory module (NVDIMM).

The computing environment 100 can include a host system 120 that is coupled to one or more memory sub-systems 110. In some embodiments, the host system 120 is coupled to different types of memory sub-system 110. FIG. 1 illustrates one example of a host system 120 coupled to one memory sub-system 110. The host system 120 uses the memory sub-system 110, for example, to write data to the memory sub-system 110 and read data from the memory sub-system 110. As used herein, "coupled to" generally refers to a connection between components, which can be an indirect communicative connection or direct communicative connection (e.g., without intervening components), whether wired or wireless, including connections such as electrical, optical, magnetic, etc.

The host system 120 can be a computing device such as a desktop computer, laptop computer, network server, mobile device, a vehicle (e.g., airplane, drone, train, automobile, or other conveyance), Internet of Things (IOT) devices, or such computing device that includes a memory and a processing device. The host system 120 can be coupled to the memory sub-system 110 via a physical host interface. Examples of a physical host interface include, but are not limited to, a serial advanced technology attachment (SATA) interface, a peripheral component interconnect express (PCIe) interface, universal serial bus (USB) interface, Fibre Channel, Serial Attached SCSI (SAS), etc. The physical host interface can be used to transmit data between the host system 120 and the memory sub-system 110. The host system 120 can further utilize an NVM Express (NVMe) interface to access the memory components, such as memory devices 130, when the memory sub-system 110 is coupled with the host system 120 by the PCIe interface. The physical host interface can provide an interface for passing control, address, data, and other signals between the memory sub-system 110 and the host system 120.

The memory devices can include any combination of the different types of non-volatile memory devices and/or volatile memory devices. The volatile memory devices (e.g., memory device 140) can be, but are not limited to, random access memory (RAM), such as dynamic random access memory (DRAM) and synchronous dynamic random access memory (SDRAM).

Some examples of non-volatile memory devices (e.g., memory device 130) include negative-and (NAND) type flash memory and write-in-place memory, such as three-dimensional cross-point ("3D cross-point") memory. A cross-point array of non-volatile memory can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased.

Although non-volatile memory components such as 3D cross-point type and NAND type memory are described, the memory device 130 can be based on any other type of non-volatile memory, such as read-only memory (ROM), phase change memory (PCM), magneto random access memory (MRAM), negative-or (NOR) flash memory, electrically erasable programmable read-only memory (EEPROM), and a cross-point array of non-volatile memory cells.

One type of memory cell, for example, single level cells (SLC) can store one bit per cell. Other types of memory cells, such as multi-level cells (MLCs), triple level cells (TLCs), and quad-level cells (QLCs), can store multiple bits per cell. In some embodiments, each of the memory devices 130 can include one or more arrays of memory cells such as SLCs, MLCs, TLCs, QLCs, or any combination of such. In some embodiments, a particular memory device can include an SLC portion, and an MLC portion, a TLC portion, or a QLC portion of memory cells. The memory cells of the memory devices 130 can be grouped as pages or codewords that can refer to a logical unit of the memory device used to store data. With some types of memory (e.g., NAND), pages can be grouped to form blocks. Some types of memory, such as 3D cross-point, can group pages across dice and channels to form management units (MUs).

The memory sub-system controller 115 can communicate with the memory devices 130 to perform operations such as reading data, writing data, or erasing data at the memory devices 130 and other such operations. The memory sub-system controller 115 can include hardware such as one or more integrated circuits and/or discrete components, a buffer memory, or a combination thereof. The hardware can include a digital circuitry with dedicated (i.e., hard-coded) logic to perform the operations described herein. The memory sub-system controller 115 can be a microcontroller, special purpose logic circuitry (e.g., a field programmable gate array (FPGA), an application specific integrated circuit (ASIC), etc.), or other suitable processor.

The memory sub-system controller 115 can include a processor (processing device) 117 configured to execute instructions stored in local memory 119. In the illustrated example, the local memory 119 of the memory sub-system controller 115 includes an embedded memory configured to store instructions for performing various processes, operations, logic flows, and routines that control operation of the memory sub-system 110, including handling communications between the memory sub-system 110 and the host system 120.

In some embodiments, the local memory 119 can include memory registers storing memory pointers, fetched data, etc. The local memory 119 can also include read-only memory (ROM) for storing micro-code. While the example memory sub-system 110 in FIG. 1 has been illustrated as including the memory sub-system controller 115, in another embodiment of the present disclosure, a memory sub-system 110 may not include a memory sub-system controller 115, and may instead rely upon external control (e.g., provided by an external host, or by a processor or controller separate from the memory sub-system).

In general, the memory sub-system controller 115 can receive commands or operations from the host system 120 and can convert the commands or operations into instructions or appropriate commands to achieve the desired access to the memory devices 130. The memory sub-system controller 115 can be responsible for other operations such as wear leveling operations, garbage collection operations, error detection and error-correcting code (ECC) operations, encryption operations, caching operations, and address translations between a logical address (e.g., logical block address (LBA, namespace) and a physical address (e.g., physical MU address, physical block address) that are associated with the memory devices 130. The memory sub-system controller 115 can further include host interface circuitry to communicate with the host system 120 via the physical host interface. The host interface circuitry can convert the commands received from the host system into command instructions to access the memory devices 130 as well as convert responses associated with the memory devices 130 into information for the host system 120.

The memory sub-system 110 can also include additional circuitry or components that are not illustrated. In some embodiments, the memory sub-system 110 can include a cache or buffer (e.g., DRAM) and address circuitry (e.g., a row decoder and a column decoder) that can receive an address from the memory sub-system controller 115 and decode the address to access the memory devices 130.

In some embodiments, the memory devices 130 include local media controllers 135 that operate in conjunction with memory sub-system controller 115 to execute operations on one or more memory cells of the memory devices 130. An external controller (e.g., memory sub-system controller 115) can externally manage the memory device 130 (e.g., perform media management operations on the memory device 130). In some embodiments, a memory device 130 is a managed memory device, which is a raw memory device combined with a local controller (e.g., local controller 135) for media management within the same memory device package. An example of a managed memory device is a managed NAND (MNAND) device.

The memory sub-system 110 includes a write scrubber 113 that can direct selective data pattern scrubbing for the memory device 130 or 140, as described herein. In some embodiments, the memory sub-system controller 115 includes at least a portion of the write scrubber 113. For example, the memory sub-system controller 115 can include a processor 117 (processing device) configured to execute instructions stored in local memory 119 for performing the operations described herein. In some embodiments, the write scrubber 113 is part of the host system 110, an application, or an operating system.

In some embodiments write scrubber 113 can be configured to execute scrubbing operations. A scrubbing operation can include rewriting the data of the memory device 130, to mitigate voltage threshold drift. For example, write scrubber 113 can first read the data and then rewrite the data to reset the threshold voltage of the memory cells of memory device 130. Aspects of the present disclosure enable the write scrubber 113 to selectively scrub data patterns of the memory device 130. For example, the write scrubber 113 can selectively rewrite a first logic state (e.g., logic '1') each scrub cycle or operation. The write scrubber 113 can selectively rewrite a second logic state (e.g., logic '0') after a threshold value of scrub cycles or operations. In such embodiments, write scrubber 113 can determine the threshold value based on a scrub factor—e.g., based on an age of the memory device 130 and a maximum voltage threshold a memory cell of memory device 130 can operate at. In some embodiments, the write scrubber 113 can include a counter and be configured to record (e.g., keep track of) a quantity of scrub cycles in which the memory cells storing the second logic state are not rewritten. For example, the write scrubber 113 can increment the counter each time a scrub operation or cycle is complete. The write scrubber 113 can compare a value of the counter with the threshold value of scrub cycles. If the write scrubber 113 determines the value of the counter satisfies the threshold value, the write scrubber 113 can rewrite each memory cell and reset the counter value. If the write scrubber 113 determines the value of the counter fails to satisfy the threshold value, the write scrubber 113 can rewrite the memory cells storing the first logic state and refrain from rewriting the memory cells storing the second logic state.

Figure 2:
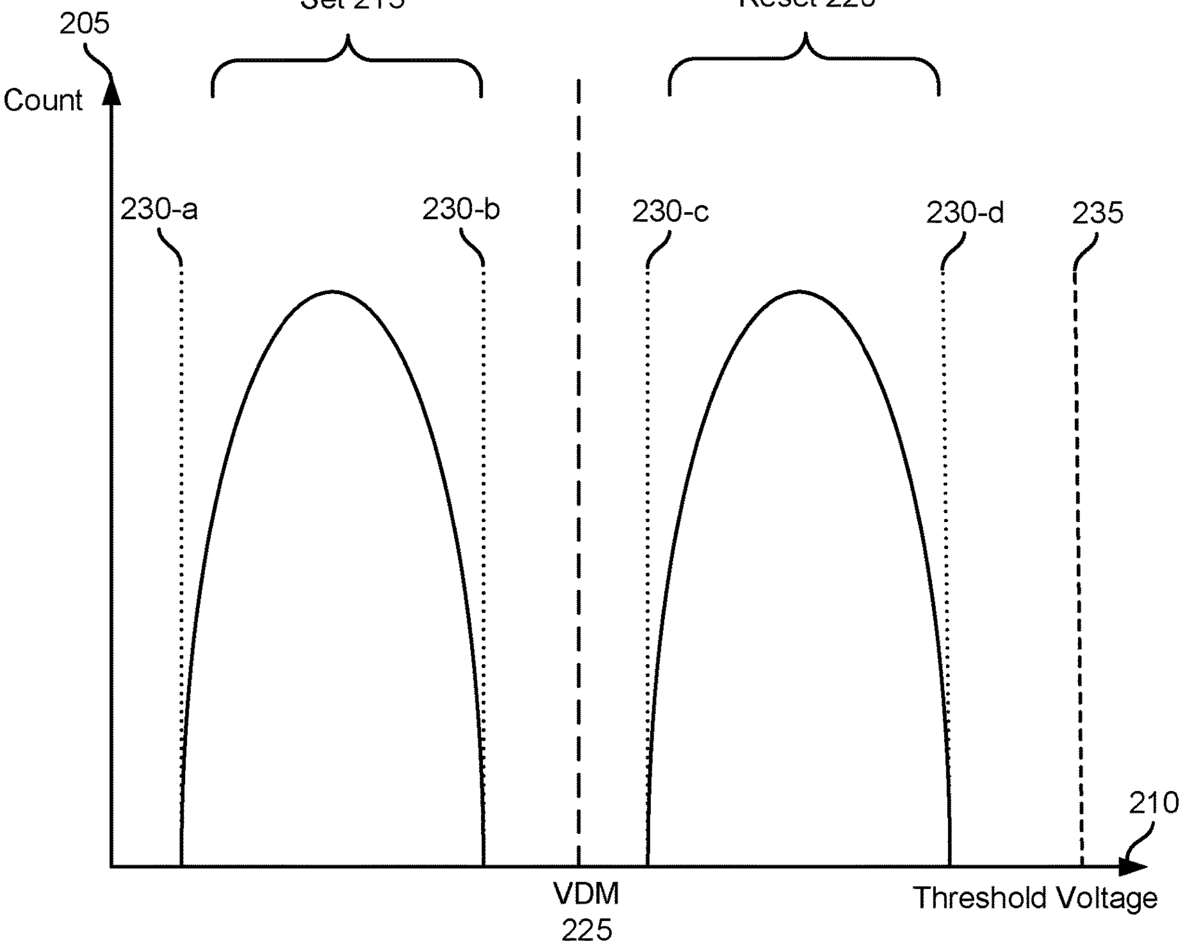
FIG. 2 is a graph illustrating logic state distributions in accordance with some embodiments.
Figure 2:
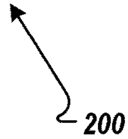

FIG. 2 is a graph illustrating logic state distributions in accordance with some embodiments. The graph of FIG. 2 illustrates a distribution of logic states in a group of 3D cross-point memory cells, where the threshold voltage (Vt) 210 is located along the x-axis and the cell count 205 is located along the y-axis. The logic states can be represented by binary values, such as "0" (or a reset state 220) and "1" (or a set state 215), or combinations of such values. The various logic states have corresponding threshold voltage 210 values. The Vt is the voltage applied to the cell circuitry (e.g., control gate at which a transistor becomes conductive) to set the state of the cell. A cell is set to one of its logic states based on the Vt that is applied to the cell. For example, if a high Vt is applied to an SLC, a charge will be present in the cell, setting the SLC to store a logic 0. If a low Vt is applied to the SLC, charge will be absent in the cell, setting the SLC to store a logic 1.

The demarcation voltage 225 (or voltage demarcation (VDM 225) level) can be a particular voltage that is applied to memory cells of a memory component to read the data stored at the memory cells. For example, if a Vt of a particular memory cell is identified as being below the demarcation voltage 225 (e.g., VDM 225 level) that is applied to the particular memory cell, then the data stored at the particular memory cell can be read as a particular value (e.g., a logical '1') or determined to be in a particular state (e.g., a set state 215). If the Vt of the particular memory cell is identified as being above the demarcation voltage 225, then the data stored at the particular memory cell can be read as another value (e.g., a logical '0') or determined to be in another state (e.g., a reset state 220). Thus, the demarcation voltage 225 can be applied to memory cells to determine values (or logical values) stored at the memory cells.

In some embodiments, a threshold voltage 210 of a first memory cell storing a respective logic state or value (e.g., for a logic '0' or logic '1') can differ from a threshold voltage 210 of a second memory cell storing the same respective logic state or value. For example, memory cells storing a set state 215 can have a threshold voltage 210 ranging from a first edge 230-*a* to a second edge 230-*b* and memory cells storing a reset state 220 can have a threshold voltage 210 ranging from a third edge 230-*c* to a fourth edge 230-*d*. Accordingly, the demarcation voltage 225 can be selected to be between the second edge 230-*b* and the third edge 230-*c*. In some embodiments, a memory sub-system can more accurately read or interpret a logic value stored at the memory cell based on a larger difference between the third edge 230-*c* and the second edge 230-*b*. In some examples, the difference between the second edge 230-*b* and the third edge 230-*c* can be referred to as a read margin (e.g., read margin value).

In some embodiments, when the threshold voltage 210 (Vt) of a memory cell changes (e.g. due to Vt drift causing a memory cell threshold value to increase over time as discussed previously), the read margin (e.g., the difference between the third edge 230-*c* and the second edge 230-*b*) can be reduced. For example, based on voltage threshold drift, application of the demarcation voltage 225 can be inaccurate relative to the changed threshold voltage. For example, when the demarcation voltage 225 is applied to the memory cell, the data stored at the memory cell can be misread or misinterpreted to be at a wrong value as compared to the value as originally stored when the threshold voltage had not yet shifted. For example, a memory cell storing the set state 215 can originally have a threshold voltage 210 at the second edge 230-*b* and then a threshold voltage 210 at the third edge 230-*c* due to voltage threshold drift over time. In such examples, when the VDM 225 is applied to the memory cell, the data stored at the memory cell can be misread as a logic '0' instead of a logic '1' due to the voltage threshold drift causing the threshold voltage 210 of the memory cell to go from below the VDM 225 to above the VDM 225. This may occur even if the VDM 225 is initially selected closer to the third edge 230-*c* than the second edge 230-*b*.

In some embodiments, the voltage threshold drift can additionally cause a memory cell to exceed a maximum threshold voltage 235 at which the memory cell is still operational. For example, a memory sub-system can have a maximum threshold voltage 235 at which components are still operational. In some examples, applying or utilizing a threshold voltage 210 beyond threshold voltage 235 may cause errors, corruption, excess power consumption, or loss of data. Accordingly, the voltage threshold drift can cause a threshold voltage 210 of a memory cell to exceed the maximum threshold voltage 235. In some embodiments, writing scrubber 113 can determine a threshold value based on determining the maximum threshold voltage 235. In some embodiments, the threshold value can be a quantity of scrub cycles or operations after which a memory cell storing a reset state 220 is rewritten to avoid exceeding the maximum threshold voltage 235—e.g., the write scrubber 113 can refrain from rewriting memory cells storing the reset state 220 until the threshold value is satisfied. In that, the threshold value is a quantity of scrub cycles a subset of memory cells can forgo before being scrubbed—e.g., memory cells storing the logic value '0'.

In at least some embodiments, the rate of the voltage threshold drift can be different for memory cells storing different values or change as the memory sub-system ages. For example, the rate of voltage threshold drift can be greater in a memory cell storing a reset state 220 than a memory cell storing a set state 215—e.g., a threshold voltage 210 storing the reset state 220 can increase quicker than a threshold voltage 210 storing the set state 215. In some embodiments, the rate of the voltage threshold drift can be greater in an end of life (EOL) state than a middle of life (MOL) state of a memory sub-system. In such embodiments, the rate of threshold drift can be greater in the MOL than a beginning of life (BOL) state of the memory sub-system. The life state of the memory sub-system can be based on the program/erase (P/E) cycle of the memory-subsystem—e.g., a quantity of times a memory cell in the memory sub-system can be programmed and erased. In some embodiments, writing scrubber 113 can determine the threshold value based on determining the life state of the memory sub-system—e.g., based on the quantity of P/E cycles the memory system has undergone. For example, the write scrubber 113 can determine a greater threshold value when the memory sub-system in BOL than in MOL or EOL. The write scrubber 113 can additionally adjust or change the threshold value based on determining the memory sub-system in a different life state—e.g., based on passing a given quantity of P/E cycles. For example, the write scrubber 113 may select ten (10) for the threshold value at BOL, six (6) for MOL, and three (3) for EOL. It should be noted other threshold values are possible and the numerical values listed herein are examples and not limiting on the claims.

In some embodiments, when the write scrubber 113 performs selective data pattern scrubbing, the write scrubber 113 can rewrite the set state 215 during each scrub cycle and rewrite the reset state 220 after the threshold value is satisfied. In some embodiments, rewriting the set state 215 and refraining from rewriting the reset state 220 can increase the read margin. That is, as memory cells storing the reset state 220 are not rewritten each time, the respective voltage thresholds of the memory cells can increase. Accordingly, the third edge 230-*c* can drift to the right (e.g., increase) while second edge 230-*b* can remain the same—e.g., based on the memory cells storing the set state 215 being rewritten each time. As such, the difference between the third edge 230-*c* and the second edge 230-*b* can increase and result in more reliable reads on the memory cells.

Figure 3:
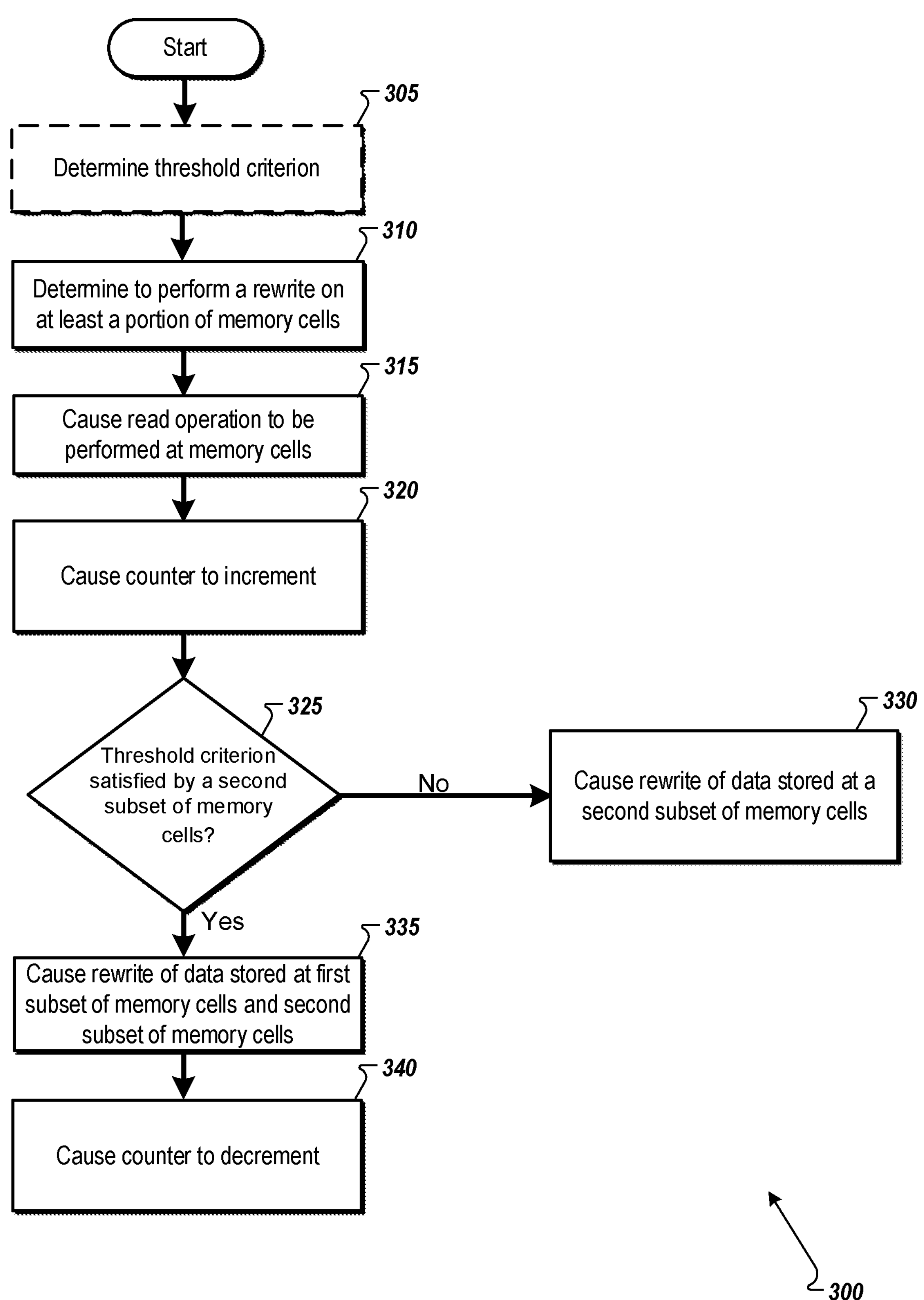
FIG. 3 is a flow diagram of an example method for performing a selective data pattern write scrub for a memory system in accordance with some embodiments.

FIG. 3 illustrates a flow diagram of an example method 300 for performing a selective data pattern write scrub for a memory system in accordance with some embodiments. The method 300 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 300 is performed by write scrubber 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 305, the processing logic determines a threshold criterion. In some embodiments, the processing logic can use a maximum operational voltage of a memory cell to select a threshold criterion for a plurality of memory cells in a page. For example, the memory sub-system can have memory cells with a maximum operational voltage—e.g., a voltage passed which the memory cells are inoperable, cannot store data, or become corrupted. The maximum operational voltage can be programed to the memory sub-system during a manufacturing process. To avoid a memory cell threshold drifting beyond the maximum threshold voltage, the memory sub-system can scrub memory cells (e.g. rewrite the memory cells) and reset the threshold voltage of the memory cell. In some embodiments, the memory sub-system controller can avoid scrubbing memory cells storing a certain logic state (e.g., storing logic '0') each scrub cycle. The memory sub-system controller can accordingly select a threshold criterion of a maximum number of rewrite operations the memory sub-system can skip before the memory cell voltage threshold will exceed the maximum operational voltage. The threshold criterion can be determined from a rate of voltage drift at the memory cells. In some embodiments, the memory cells can begin to have increased voltage threshold drift as they age. That is, as the memory sub-system performs program/erase cycles (P/E), the rate of voltage threshold drift can increase at the memory cells. In some embodiments, a number of program/erase cycles performed can fall within a BOL, MOL, or an EOL of the memory sub-system. The memory sub-system controller can accordingly adjust a threshold criterion when the memory sub-system goes from a BOL to a MOL or from a MOL to EOL—e.g., as the memory sub-system ages, the number of scrub cycles before the memory cell threshold exceeds the maximum threshold voltage can decrease and the memory sub-system can accordingly select a different threshold criterion.

At operation 310, the processing logic determines to perform a rewrite on at least a portion of memory cells of the plurality of memory cells. In some embodiments, the processing logic can periodically performs scrub operations to mitigate voltage threshold drift. In such embodiments, the processing logic can determine to perform a rewrite operation to execute the scrub operation. The memory sub-system controller can determine to perform a rewrite operation based on a garbage collection or media management algorithm or after a defined duration. For example, the processing logic can determine to perform a rewrite operation after a certain duration based on a scrub cycle for the whole memory system. In some embodiments, the processing logic can determine the duration between scrub cycles based on the rate of voltage threshold drift. For example, a relatively shorter duration for a faster rate of voltage threshold drift and a relatively long duration for a slower rate of voltage threshold drift. In some embodiments, after determining to perform a scrub operation, the memory sub-system controller can send a scrub command to the memory device 130 (e.g., to the local media controller 135). In such embodiments the memory sub-system controller can first activate a selective scrub feature at the local media controller 135. That is, the local media controller 135 can be programmed with a selective scrub feature, which the memory system controller can activate.

At operation 315, the processing logic causes a read operation to be performed at the plurality of memory cells. In response to the read operation, the processing logic can determine a logic value stored at a respective memory cell. By performing the read operation, the processing logic can determine which logic value a memory cell stores—e.g., by applying the VDM voltage as described above. For example, the processing logic can determine whether a memory cell stores a logic value '1' or a logic value '0'. In some examples, the memory cells storing the a logic value '1' or set state in a page can be considered a first subset of memory cells and the memory cells storing the logic value '0' or reset state can be considered a second subset of memory cells. In some embodiments, the read operation can be performed by a local media controller 135.

At operation 320, the processing logic causes a counter to increase in value in response to determining to perform a rewrite operation (e.g., a scrub operation). In some embodiments, the processing logic can monitor the number of scrub cycles subsequent to a rewrite operation performed at the first subset of memory cells—e.g., determine the number of scrub cycles that have elapsed since the memory cells of the first subset were rewritten to the first state. In such embodiments, the processing logic can increase the counter by a value one (1) each time a scrub operation is performed. In some embodiments, the memory sub-system controller can track the number of scrub operations at a given page. In at least one embodiment, the memory sub-system controller can increase the count when the memory sub-system controller sends the scrub command to the local media controller 135.

At operation 325, the processing logic determines whether the number of rewrite operations at the memory cells storing the logic '1' satisfies the threshold criterion. In some examples, the memory sub-system controller can track the number of scrub operations performed at page storing memory cells. In at least one embodiment, because the memory cells storing a logic '1' are rewritten each time, the memory sub-system controller can track the number of write operations at memory cells storing the logic '1'. In some embodiments, the processing logic can compare the first value (e.g., the count value or number of rewrite operations performed at the memory cells storing the logic '1') to the threshold criterion. In such embodiments, the processing logic can determine whether the memory cells storing the logic state '0' should be rewritten to avoid exceeding the maximum threshold voltage as described with reference to FIG. 2. If the processing logic determines the current number of rewrite operations performed at the memory cells storing the logic '1' are less than the threshold criterion, the processing logic can proceed to operation 330. If the processing logic determines the current number of rewrite operations performed at the memory cells storing the logic '1' satisfy (e.g., exceed or meet), the processing logic can proceed to operation 335. In some embodiments, the memory sub-system controller can determine if the current number of rewrite operations performed at the memory cells storing the logic '1' satisfy the threshold. In such embodiments, the memory sub-system controller can send a scrub command to rewrite all memory cells if the threshold criterion is satisfied and send a scrub command to rewrite memory cells storing a logic '1' if the threshold criterion is not satisfied.

At operation 330, the processing logic can rewrite data stored at memory cells storing the logic '1'—e.g., the second subset of memory cells can be rewritten. If the processing logic determines the number of rewrite operations performed at the memory cells storing a logic '1' fail to satisfy the threshold criterion, the processing logic can also avoid or skip rewriting memory cells storing a logic '0' in a page. For example, a local media controller 135 can receive a scrub command from the memory sub-system controller specifying a scrub operation at only memory cells storing a logic '1'. Accordingly, the local media controller 135 can read all of the data out of the page. This enables the local media controller 135 to determine which memory cells of the page store the logic '1' or the logic '0.' When the local media controller 135 rewrites the data to the page, the local media controller can skip (e.g., bypass, be inhibited to) writing to memory cells storing a logic '0.' In some embodiments, the local media controller 135 can be inhibited to write to memory cells storing a logic '0' when the memory sub-system controller enables the selective write feature. By selectively refraining from rewriting the memory cells storing the logic '0' each time, the processing logic can increase bandwidth and reduce media degradation as described above. Additionally, by rewriting the memory cells storing the logic '1' each time and refraining from rewriting the memory cells storing the logic '0', the processing logic can increase the read margin as described with reference to FIG. 2.

At operation 335, the processing logic can rewrite data stored at the memory cells storing the logic '1' and the logic '0'—e.g., at each memory cell of the page. In such embodiments, the local media controller 135 can read out the data of the page and rewrite the data back to each memory cell—e.g., the local media controller 135 will not be inhibited. In at least some embodiments, the processing logic can rewrite the data stored at the memory cells having a logic '1' by writing the memory cells to the logic '0' first and then to the logic '1' (e.g., to the first logic value and the second logic value). That is, the processing logic can write the memory cells to the intended state by first writing the memory cells to an opposite state. Performing such a rewrite operation can cause a smaller distribution of threshold voltages of the second subset of memory cells—e.g., a difference between second edge 230-*b* and first edge 230-*a* can be reduced. In some embodiments, the processing logic can rewrite data at memory cells storing a logic '1' by writing the memory cells to the logic value '1'. In such embodiments, the processing logic can refrain from writing the memory cells to the logic '0' first.

At operation 340, the processing logic can cause the counter to decrease by the value e.g., decrease by the current value of the counter to zero (0). If the processing logic performs a rewrite operation on the memory cells storing the logic '0', the processing logic can reset (e.g., decrement) the counter to the value zero. This can enable the processing logic to continue tracking a number of rewrite operations (scrub operations) performed subsequent to rewriting the memory cells storing the logic '1'. In at least one embodiment, the memory sub-system controller can cause the counter to be reset.

In the embodiments of FIG. 3, the method 300 can be iterated through for rewrite or scrub operations of memory device 130 until the EOL of the memory device 130. If there is no additional rewrite operations, the method 300 can end.

Figure 4A:
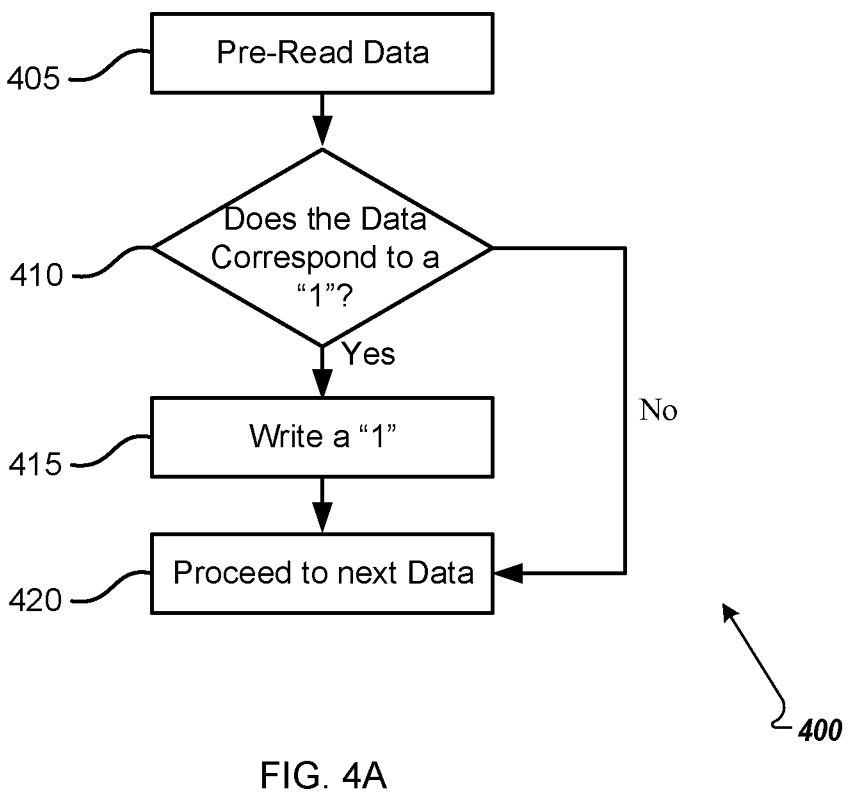
FIGS. 4A & 4B are flow diagrams of example rewrite methods for performing a selective data pattern write scrub for a memory system in accordance with some embodiments.
Figure 4B:
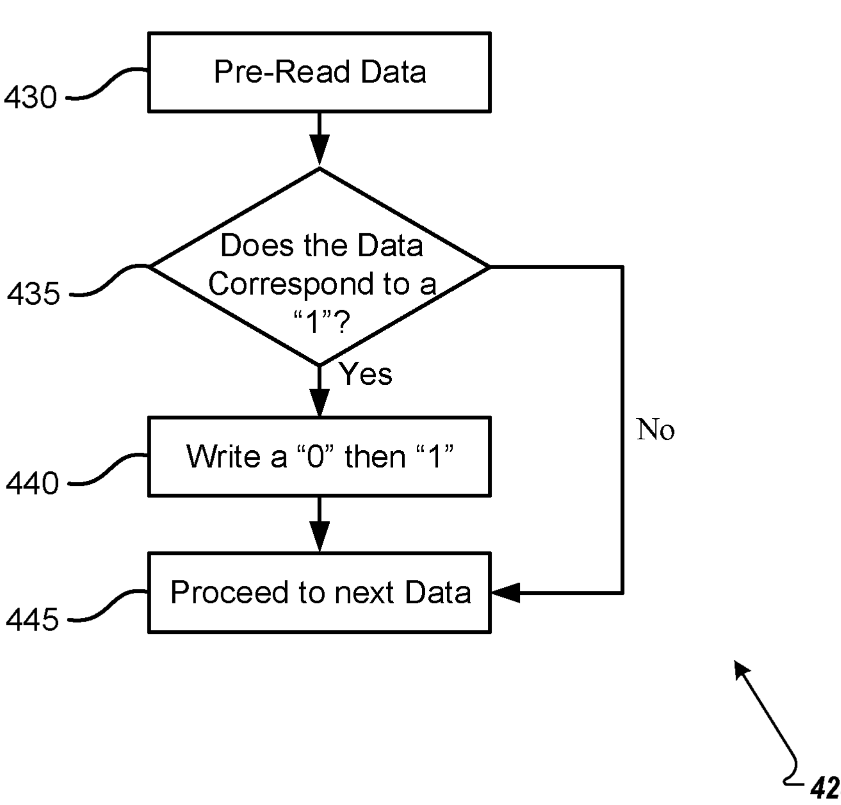

FIGS. 4A and 4B illustrate flow diagrams of an example method 400 and 425 for performing rewrite operation for a selective data pattern write scrub for a memory system in accordance with some embodiments. The method 400 and 425 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 400 and 425 is performed by write scrubber 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible. Method 400 and 425 illustrate possible rewrite (e.g., write back operations or scrub operations) the processing logic can perform at operation 335 described with reference to FIG. 3.

At operation 405, the processing logic can cause a pre-read operation on data stored at a memory device. In some embodiments, the data can be referred to as a subset of data or a data pattern. The processing logic can pre-read a data pattern or a subset of data stored at a page, a management unit, or an SMU.

At operation 410, the processing logic can determine whether the data corresponds to a certain logic state or value (e.g., to a logic '1' or a logic '0') in response to the pre-read. If the processing logic determines the data corresponds to a logic '1,' the processing logic can proceed to operation 415. If the processing logic determines the data does not correspond to logic '1,' the processing logic can proceed to operation 420.

At operation 415, the processing logic can cause a write operation to write a logic '1' to the memory cells storing the data—e.g., memory cells of the page, MU, or SMU.

At operation 420, the processing logic can proceed to a next data pattern or next data subset. The processing logic can repeat operations 405-420 until the rewrite operation is complete.

FIG. 4B illustrate a second rewrite operation the processing logic can perform. In some embodiments, the processing logic can perform either the method 400, the method 425, or a combination thereof.

At operation 430, the processing logic can cause a pre-read operation on data stored at a memory device. In some embodiments, the data can be referred to as a subset of data or a data pattern. The processing logic can pre-read a data pattern or a subset of data stored at a page, MU, or SMU.

At operation 435, the processing logic can determine whether the data corresponds to a logic value '0' or a logic value '1' in response to the pre-read. If the processing logic determines the data corresponds to a logic '1,' the processing logic can proceed to operation 440. If the processing logic determines the data does not correspond to logic '1,' the processing logic can proceed to operation 445.

At operation 440, the processing logic can cause a first write operation to write a logic '0' to the memory cells storing the data—e.g., memory cells of the page, MU, or SMU. The processing logic can then cause a second write operation to write a logic '1' to the memory cells e.g., the intended state.

At operation 445, the processing logic can proceed to a next data pattern or next data subset. The processing logic can repeat operations 430-445 until the rewrite operation is complete.

Figure 5:
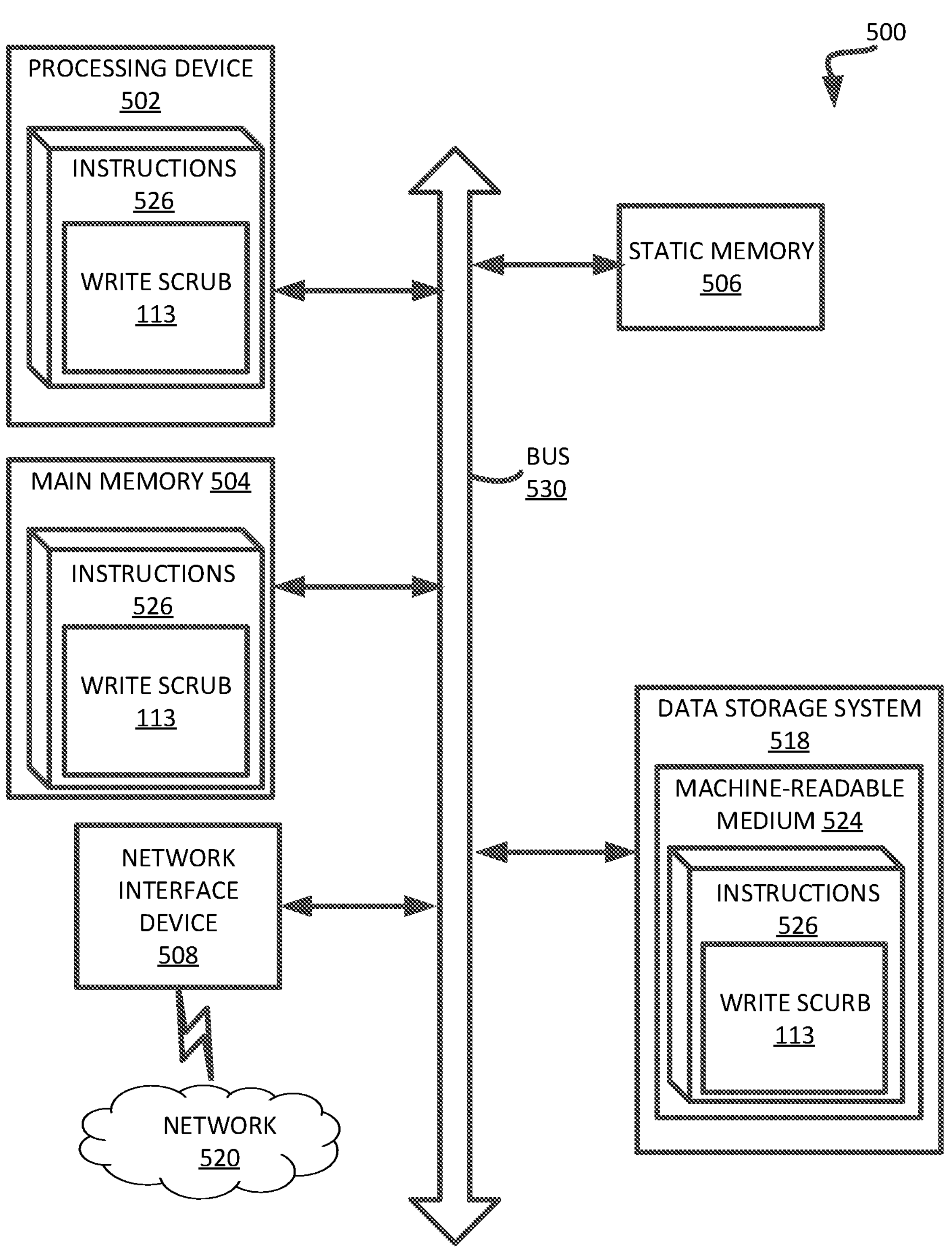
FIG. 5 is a block diagram of an example computer system in which embodiments of the present disclosure can operate.

FIG. 5 illustrates an example machine of a computer system 500 within which a set of instructions, for causing the machine to perform any one or more of the methodologies discussed herein, can be executed. In some embodiments, the computer system 500 can correspond to a host system (e.g., the host system 120 of FIG. 1) that includes, is coupled to, or utilizes a memory sub-system (e.g., the memory sub-system 110 of FIG. 1) or can be used to perform the operations of a controller (e.g., to execute an operating system to perform operations corresponding to the write scrubber 113 of FIG. 1). In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 500 includes a processing device 502, a main memory 504 (e.g., read-only memory (ROM), flash memory, dynamic random access memory (DRAM) such as synchronous DRAM (SDRAM) or RDRAM, etc.), a static memory 506 (e.g., flash memory, static random access memory (SRAM), etc.), and a data storage system 518, which communicate with each other via a bus 530.

Processing device 502 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 502 can also be one or more special-purpose processing devices such as an application specific integrated circuit (ASIC), a field programmable gate array (FPGA), a digital signal processor (DSP), network processor, or the like. The processing device 502 is configured to execute instructions 526 for performing the operations and steps discussed herein. The computer system 500 can further include a network interface device 508 to communicate over the network 520.

The data storage system 518 can include a machine-readable storage medium 524 (also known as a non-transitory computer-readable medium) on which is stored one or more sets of instructions 526 or software embodying any one or more of the methodologies or functions described herein. The instructions 526 can also reside, completely or at least partially, within the main memory 504 and/or within the processing device 502 during execution thereof by the computer system 500, the main memory 504 and the processing device 502 also constituting machine-readable storage media. The machine-readable storage medium 524, data storage system 518, and/or main memory 504 can correspond to the memory sub-system 110 of FIG. 1.

In one embodiment, the instructions 526 include instructions to implement functionality corresponding to a read and write voltage managing component (e.g., write scrubber 113 of FIG. 1). While the machine-readable storage medium 524 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general purpose computer selectively activated or reconfigured by a computer program stored in the computer. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMS, EEPROMs, magnetic or optical cards, or any type of media suitable for storing electronic instructions, each coupled to a computer system bus.

The algorithms and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory components, etc.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. A system comprising:

a memory device comprising a plurality of memory cells, wherein a first subset of the plurality of memory cells store a first logic state and a second subset of the plurality of memory cells store a second logic state; and a processing device operatively coupled to the memory device, the processing device to perform operations comprising:

determining to perform a rewrite operation on at least a portion of the plurality of memory cells;

determining a threshold criterion based on a maximum operational voltage of the plurality of memory cells, wherein the threshold criterion comprises a number of scrub cycles for which the processing device is to refrain from rewriting data stored at the first subset of the plurality of memory cells;

determining that a number of rewrite operations performed at the second subset of the plurality of memory cells fail to satisfy the threshold criterion based on comparing the number of rewrite operations performed to the threshold criterion; and responsive to determining that the number of rewrite operations performed at the second subset of the plurality of memory cells fail to satisfy the threshold criterion, causing a rewrite of data stored at the second subset of the plurality of memory cells while refraining from rewriting data stored at the first subset of the plurality of memory cells.

2. The system of claim 1, wherein the operations further comprise:

determining a rate of voltage drift at the plurality of memory cells; and responsive to determining the rate of voltage drift at the plurality of memory cells, adjusting the threshold criterion based on the rate of voltage drift.

3. The system of claim 1, wherein the operations further comprise:

determining a number of program/erase cycles performed by the plurality of memory cells; and responsive to determining the number of program/erase cycles performed by the plurality of memory cells, adjusting the threshold criterion based on the number of program/erase cycles.

4. The system of claim 1, wherein the operations further comprise:

responsive to determining to perform the rewrite on at least the portion of the plurality of memory cells, incrementing a counter of the number of rewrite operations performed at the second subset of memory cells by a first value; and decrementing the counter of the number of rewrite operations performed at the second subset of memory cells by a second value based at least in part on rewriting the data stored at the first subset of the plurality of memory cells.

5. The system of claim 1, wherein the operations further comprise:

responsive to determining that the number of rewrite operations performed at the second subset of the plurality of memory cells satisfy the threshold criterion, causing a rewrite of data stored at the first subset of the plurality of memory cells; and responsive to determining that the number of rewrite operations performed at the second subset of the plurality of memory cells satisfy the threshold criterion, causing a rewrite of data stored at the second subset of the plurality of memory cells.

6. The system of claim 1, wherein causing the rewrite of data stored at the second subset of the plurality of memory cells comprise:

causing a first write operation to be performed and write a first logic state to the second subset of the plurality of memory cells; and causing a second write operation to be performed and write a second logic state to the second subset of the plurality of memory cells.

7. The system of claim 1, wherein causing the rewrite of data stored at the second subset of the plurality of memory cells comprise:

causing a first write operation to be performed and write a first logic state to the second subset of the plurality of memory cells.

8. The system of claim 1, wherein the operations further comprise:

causing a read operation to be performed at the plurality of memory cells; and responsive to the read operation, determining the first subset of the plurality of memory cells and the second subset of the plurality of memory cells.

9. A method comprising:

determining, by a processing device, to perform a rewrite operation on at least a portion of a plurality of memory cells of a memory device, wherein a first subset of the plurality of memory cells store a first logic state and a second subset of the plurality of memory cells store a second logic state;

determining a threshold criterion based on a maximum operational voltage of the plurality of memory cells, wherein the threshold criterion comprises a number of scrub cycles for which the processing device is to refrain from rewriting data stored at the first subset of the plurality of memory cells;

determining that a number of rewrite operations performed at the second subset of the plurality of memory cells fail to satisfy the threshold criterion based on comparing the number of rewrite operations performed to the threshold criterion; and responsive to determining that the number of rewrite operations performed at the second subset of the plurality of memory cells fail to satisfy the threshold criterion, causing a rewrite of data stored at the second subset of the plurality of memory cells while refraining from rewriting data stored at the first subset of the plurality of memory cells.

10. The method of claim 9, wherein the operations further comprise:

determining a rate of voltage drift at the plurality of memory cells; and responsive to determining the rate of voltage drift at the plurality of memory cells, adjusting the threshold criterion based on the rate of voltage drift.

11. The method of claim 9, wherein the operations further comprise:

determining a number of program/erase cycles performed by the plurality of memory cells; and responsive to determining the number of program/erase cycles performed by the plurality of memory cells, adjusting the threshold criterion based on the number of program/erase cycles.

12. The method of claim 9, wherein the operations further comprise:

responsive to determining to perform the rewrite on at least the portion of the plurality of memory cells, incrementing a counter of the number of rewrite operations performed at the second subset of memory cells by a first value; and decrementing the counter of the number of rewrite operations performed at the second subset of memory cells by a second value based at least in part on rewriting the data stored at the first subset of the plurality of memory cells.

13. The method of claim 9, wherein the operations further comprise:

responsive to determining that the number of rewrite operations performed at the second subset of the plurality of memory cells satisfy the threshold criterion, causing a rewrite of data stored at the first subset of the plurality of memory cells; and responsive to determining that the number of rewrite operations performed at the second subset of the plurality of memory cells satisfy the threshold criterion, causing a rewrite of data stored at the second subset of the plurality of memory cells.

14. The method of claim 9, wherein causing the rewrite of data stored at the second subset of the plurality of memory cells comprise:

causing a first write operation to be performed and write a first logic state to the second subset of the plurality of memory cells; and causing a second write operation to be performed and write a second logic state to the second subset of the plurality of memory cells.

15. The method of claim 9, wherein causing the rewrite of data stored at the second subset of the plurality of memory cells comprise:

causing a first write operation to be performed and write a first logic state to the second subset of the plurality of memory cells.

16. The method of claim 9, wherein the operations further comprise:

causing a read operation to be performed at the plurality of memory cells; and responsive to the read operation, determining the first subset of the plurality of memory cells and the second subset of the plurality of memory cells.

17. A non-transitory computer-readable medium storing instructions, which when executed by a processing device that is operatively coupled with a memory device, performing a plurality of operations comprising:

determining to perform a rewrite operation on at least a portion of a plurality of memory cells of a memory device, wherein a first subset of the plurality of memory cells store a first logic state and a second subset of the plurality of memory cells store a second logic state;

determining a threshold criterion based on a maximum operational voltage of the plurality of memory cells, wherein the threshold criterion comprises a number of scrub cycles for which the processing device is to refrain from rewriting data stored at the first subset of the plurality of memory cells;

determining that a number of rewrite operations performed at the second subset of the plurality of memory cells fail to satisfy the threshold criterion based on comparing the number of rewrite operations performed to the threshold criterion; and responsive to determining that the number of rewrite operations performed at the second subset of the plurality of memory cells fail to satisfy the threshold criterion, causing a rewrite of data stored at the second subset of the plurality of memory cells while refraining from rewriting data stored at the first subset of the plurality of memory cells.

18. The non-transitory computer-readable medium of claim 17, wherein the plurality of operations further comprises:

determining a rate of voltage drift at the plurality of memory cells; and responsive to determining the rate of voltage drift at the plurality of memory cells, adjusting the threshold criterion based on the rate of voltage drift.

* * * * *